US008587959B2

(12) United States Patent
Trüssel et al.

(10) Patent No.: US 8,587,959 B2

(45) Date of Patent: Nov. 19, 2013

(54) ELECTRIC MODULE WITH A FASTENING DEVICE

(75) Inventors: Dominik Trüssel, Bremgarten (CH); Daniel Schneider, Bellikon (CH)

(73) Assignee: ABB Technology AG, Zürich (CH)

( * ) Notice: Subject to any disclaimer, the term of this patent is extended or adjusted under 35 U.S.C. 154(b) by 160 days.

(21) Appl. No.: 13/224,398

(22) Filed: Sep. 2, 2011

(65) Prior Publication Data

US 2012/0014072 A1 Jan. 19, 2012

Related U.S. Application Data

(63) Continuation of application No. PCT/EP2010/052586, filed on Mar. 2, 2010.

(30) Foreign Application Priority Data

Mar. 3, 2009 (EP) .................................... 09154172

(51) Int. Cl.
*H05K 7/02* (2006.01)
*H05K 7/04* (2006.01)

(52) U.S. Cl.
USPC .......................................... 361/809; 361/810

(58) Field of Classification Search
USPC ............ 361/807, 809, 810; 174/138 E, 138 G
See application file for complete search history.

(56) References Cited

U.S. PATENT DOCUMENTS

| | | | | |
|---|---|---|---|---|
| 5,756,972 | A | 5/1998 | Vranicar et al. | |
| 6,234,850 | B1 * | 5/2001 | Pandit et al. | 439/801 |
| 6,322,376 | B1 | 11/2001 | Jetton | |
| 6,361,382 | B1 | 3/2002 | Yamada et al. | |
| 7,553,200 | B2 * | 6/2009 | Plummer | 439/766 |
| 7,892,049 | B1 * | 2/2011 | Andler et al. | 439/801 |
| 8,251,756 | B2 * | 8/2012 | Matsuoka | 439/737 |
| 2002/0128519 | A1 * | 9/2002 | Ernst et al. | 568/460 |
| 2008/0146074 | A1 | 6/2008 | Deisenhofer | |

FOREIGN PATENT DOCUMENTS

| | | | |
|---|---|---|---|
| DE | 297 13 205 | U1 | 9/1997 |
| EP | 0 521 803 | A | 1/1993 |
| EP | 1 933 421 | A2 | 6/2008 |
| GB | 2 076 492 | A | 12/1981 |
| WO | WO 96/13080 | A2 | 5/1996 |
| WO | WO 2005/025005 | A | 3/2005 |

OTHER PUBLICATIONS

International Search Report (PCT/ISA/210) issued on Jun. 10, 2010, by European Patent Office as the International Searching Authority for International Application No. PCT/EP2010/052586.
Search Report issued on Aug. 3, 2009, by European Patent Office for Application No. 09154172.2.

* cited by examiner

*Primary Examiner* — Hung S Bui

(74) *Attorney, Agent, or Firm* — Buchanan Ingersoll & Rooney PC

(57) ABSTRACT

A fastening device for an electric module is disclosed. The fastening device is adapted for fastening at least one electric conductor unit at an electric module and includes a screw nut compartment adapted to receive a screw nut. The screw nut compartment has an open first side for inserting at least one of the screw nut and a screw. A second side arranged opposite to the first side. The fastening device further includes a stiffening extension formed at the second side of the screw nut compartment, wherein the stiffening extension has a non-circular cross section.

25 Claims, 4 Drawing Sheets

ELECTRIC MODULE WITH A FASTENING DEVICE

RELATED APPLICATIONS

This application claims priority as a continuation application under 35 U.S.C. §120 to PCT/EP2010/052586, which was filed as an International Application on Mar. 2, 2010 designating the U.S., and which claims priority to European Application 09154172.2 filed in Europe on Mar. 3, 2009. The entire contents of these applications are hereby incorporated by reference in their entireties.

FIELD

The present disclosure generally relates to an electric module, such as, an electric module with a fastening device and a method of fastening or unfastening an electronic conductor unit to an electric module.

BACKGROUND INFORMATION

The miniaturisation of electric modules, such as, power semiconductors which include, the example, transistors, insulated gate bipolar transistors, diodes, or other suitable devices as desired, is an objective in the development of electric modules in particular in the development of power semiconductor modules. Due to the materials used for the housing of the electric modules, this miniaturisation can result in more fragile devices. In addition, because the walls of the device housings cannot be formed with an arbitrary thickness by injection molding, and it can be difficult forming walls thicker for example, than about 2 mm using this technique, limits can be imposed on the device stability. Therefore, the devices have to be handled carefully during assembly and mounting.

As each electric module needs to be connected to a power source via an electric connector, it is desirable to build electric or electronic devices which can be connected and therefore supplied with power without causing damage to the damageable structures of the electric device.

SUMMARY

An electric module including a fastening device adapted for fastening at least one electric conductor unit to be fastened at the electric module. The fastening device, which is part of the housing of the electric module, including a screw nut compartment adapted to receive a screw nut, the screw nut compartment having an open first side for inserting at least one of the screw nut and a screw; and a second side arranged opposite to the first side, a stiffening extension formed at the second side of the screw nut compartment wherein the stiffening extension has a non-circular cross section.

An exemplary method for fastening or unfastening at least one electric conductor unit to or from a fastening device of an electric module is disclosed the fastening device includes a screw nut compartment in which a screw nut is provided, and a threaded connector for holding the electric conductor, the threaded connector being inserted into the screw nut from an open first side of the screw-nut compartment, the method comprising turning a threaded connector along a central axis of a screw nut; applying a torque from the screw nut to the screw-nut compartment; and providing a counter-torque in response to the torque applied by the screw nut, by means of a stiffening extension formed at a second side of the screw nut compartment opposite to the first side, the stiffening extension having a non-circular cross section; and wherein the counter-torque results from an interaction of the stiffening extension with a surrounding solid or viscous material of the electric module contacting an outer surface of the stiffening section.

BRIEF DESCRIPTION OF THE DRAWINGS

A full and enabling disclosure, is set forth in the remainder of the specification with reference to the accompanying drawings wherein.

DETAILED DESCRIPTION

Figure 1:
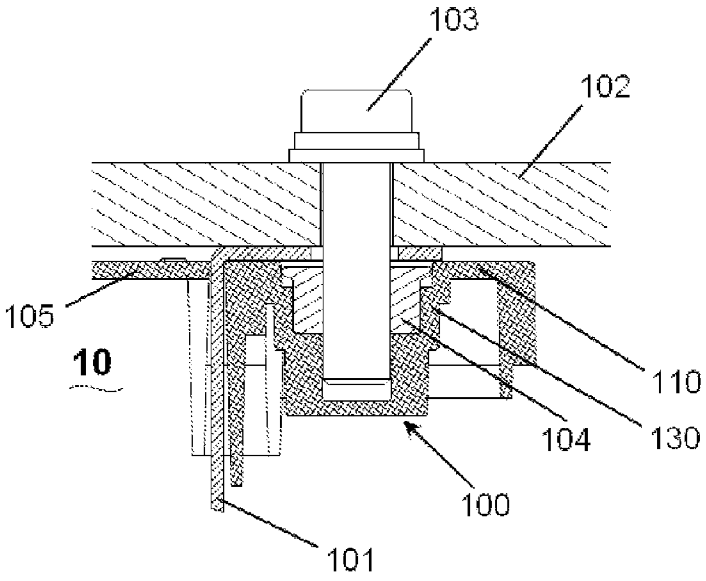
FIG. 1 illustrates a partial sectional view of a part of an electric module in accordance with an exemplary embodiment.

Reference will now be made in detail to the various exemplary embodiments, one or more examples of which are illustrated in the drawings. Each example is provided by way of explanation and is not meant as a limitation. For example, features illustrated or described as part of one embodiment can be used on or in conjunction with other embodiments to yield yet a further embodiment. It is intended that the present disclosure includes such modifications and variations.

In the description of the embodiments below, like structural features are identified by the same reference symbols in the drawings. The structures shown in the drawings are not depicted true to scale but rather serve only for the better understanding of the embodiments.

In an exemplary embodiment of the present disclosure an electric module includes a fastening device that adapted for fastening at least one electric conductor unit to be fastened at the electric module, and the fastening device includes a screw nut compartment adapted to receive a screw nut, wherein the screw nut compartment has an open first side for inserting at least one of the screw nut and a screw, and a second side arranged opposite to the first side. The fastening device further includes a stiffening extension formed at the second side of the screw nut compartment, wherein the stiffening extension has a non-circular cross section, and particularly a non-circular outer cross section.

The stiffening extension of the fastening device can provide a toothing, and the number of teeth of the stiffening extension can correspond to the number of side faces of the screw nut and/or the screw nut compartment.

The screw nut compartment of the fastening device can have a hexagonal shape.

In another exemplary embodiment, a part of the housing of the electric module including the fastening device is formed by injection molding. The walls of the stiffening compartment can be, for example, less than 3 mm thick, and more preferably less than 2.5 mm thick. In other exemplary embodiments the thickness of the walls can be within a range of 1.5 mm to 2.5 mm.

The screw nut compartment and the stiffening extension of the fastening device as described can be formed as an integral unit.

In an exemplary embodiment of the present disclosure the housing of the electric module includes a lid. The lid can include a fastening device as described above.

In another exemplary embodiment of the present disclosure, a method for fastening or unfastening at least one electric conductor unit to or from a fastening device of an electric module is provided. Here, the fastening device includes a screw nut compartment in which a screw nut is provided, and a threaded connector for holding the electric connector, the threaded connector being inserted into the screw nut from an open first side of the screw-nut compartment. The method includes turning a threaded connector along a central axis of a screw nut, applying a torque from the screw nut to the screw-nut compartment, and providing a counter-torque in response to the torque applied by the screw nut, by means of a stiffening extension formed at a second side of the screw nut compartment opposite to the first side. The stiffening extension having a non-circular cross section. The counter-torque results from an interaction of the stiffening extension with a surrounding solid or viscous material of the electric module contacting an outer surface of the stiffening section.

FIG. 1 illustrates a partial sectional view of a part of an electric module in accordance with an exemplary embodiment. As shown in FIG. 1, an electric module 10 can be electrically connected to the outside by one or more terminals 101, such as a power supply terminal, a control terminal (e.g., a gate terminal) or other suitable component as desired. The terminal 101 can be connected to a respective electrical conductor unit 102 (e.g., a cable) which provides the actual connection to the outside and which needs to be fastened at the electric module 10.

A fastening device 100 of the electric module 10 can be used in order to mechanically and electrically connect and to fasten the one or more electric conductor unit(s) 102 to the one or more terminals 101 of the electric module 10.

The electric conductor unit 102 can be fastened by a screw 103 (e.g., threaded connector), which to this purpose is fastened in a screw nut 104 (e.g., a hex nut) in order to provide a hold for the electric conductor unit 102 to the terminal 101. The screw nut 104 can be placed in a screw nut compartment 130, i.e. in a recess which is form-fit to the shape of the screw nut. In the case of a hex nut, this recess can be a hex nut compartment. The screw nut 104 can be held in the screw nut compartment 130 by the terminal 101. However, it is also possible to hold the screw nut by other suitable means in the screw nut compartment 130.

The fastening device can be used for reliably connecting the electric module 10 to the electric conductor unit 102 (e.g. a power supply), to ensure a proper function during operation throughout the lifetime of the electric module.

The fastening device 100 can be part of the housing of the electric module 10 or a lid 105 of the housing of the electric module 10. The fastening device 100, the entire lid 105 or the housing of the electric module 10, can be made from or contain plastics such as polypropylene or polyethylene according to construction specification as desired.

When fastening or unfastening the electric conductor unit 102, a torque can appear which is transferred to the body 110 in which the screw nut compartment 130 is situated. The torque applied by the fastening or unfastening process may cause damage to the body 110, which can be the lid or the housing of the electric module, a part of an electric module, the electric module itself or the like. In some cases, the body 110 can be damaged or even break due to the influence of the torque.

To prevent the body 110 from breaking due to the applied torque, exemplary embodiments of the present disclosure hinder the torque to interact with the body 110.

In the following, any cross-section can be defined in a plane perpendicular to an axis of the screw nut compartment 130, which having the central axis of a screw nut 104 inserted in the screw nut compartment 130 as shown in FIG. 1. In each Figure, the direction of the axis of the screw nut compartment is given by the z-axis so that the described cross sections are in the x-y-plane.

In an exemplary embodiment of the present disclosure, the fastening device 100 of the electric module has the screw nut compartment 130 with an open first side for inserting a screw nut 104 and/or a screw, and a stiffening extension 150 is provided at a second side of the screw nut compartment 130. In the context of the present disclosure the term "stiffening" means that the extension is adapted for contributing to the torsional stiffness of the fastening device 100, by having a non-circular cross section. The term does not imply any further material properties of the stiffening extension.

Figure 2:
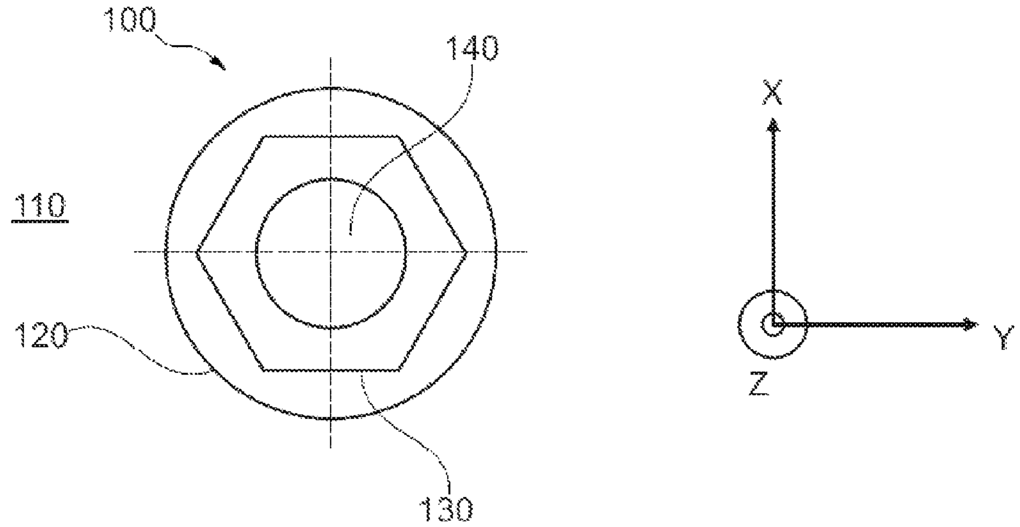
FIG. 2 illustrates a fastening device of the electric module shown from a first side in an x-y-plane in accordance with an exemplary embodiment.

FIG. 2 illustrates a fastening device of the electric module shown from a first side in an x-y-plane in accordance with an exemplary embodiment. As shown in FIG. 2, a body 110 is provided, in which or on which the fastening device can be located. The fastening device 100 has an exemplary recess 120, in which the screw nut compartment 130 is formed.

In another exemplary embodiment, the screw nut compartment 130 can have the shape of a hexagon. In the figures, an exemplary screw nut compartment 130 is shown in a hexagonal shape, but the screw nut compartment 130 can also have any other convenient shape, which is capable of housing a screw nut with a corresponding shape for example a square or octagonal shape.

In other exemplary embodiments of the present disclosure, which can be combined with any other embodiments described herein, the fastening device can include a cavity 140, which is adapted for holding a threaded connector.

Figure 3A:
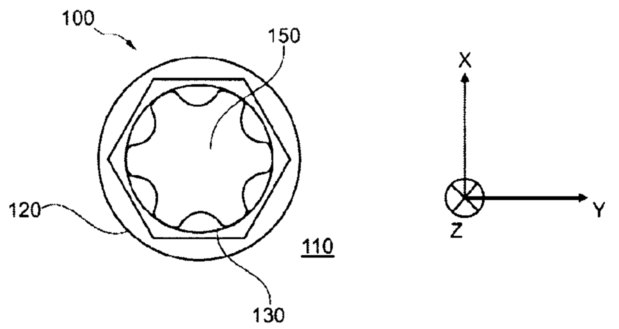
FIG. 3*a* illustrates a first fastening device of the electric module shown from a second side in the x-y-plane in accordance with an exemplary embodiment.
Figure 3B:
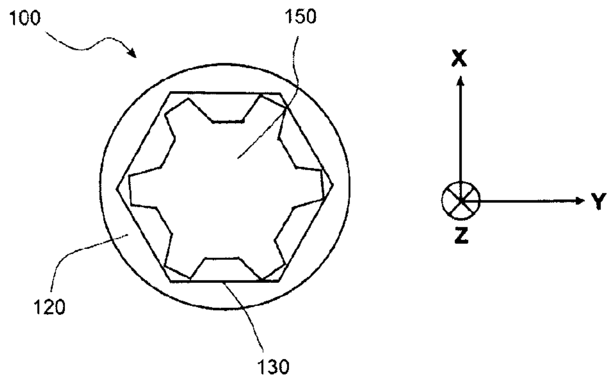
FIG. 3*b* illustrates a second fastening device of the electric module shown from a second side in the x-y-plane in accordance with an exemplary embodiment.
Figure 3C:
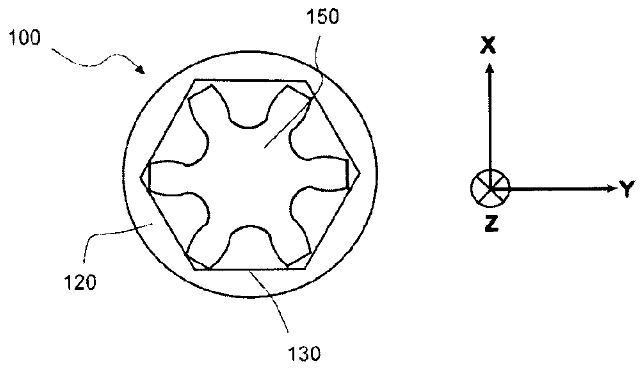
FIG. 3*c* illustrates a third fastening device of the electric module shown from a second side in the x-y-plane in accordance with an exemplary embodiment.

FIG. 3*a* illustrates a fastening device of the electric module, shown from a second side in the x-y-plane in accordance with an exemplary embodiment. FIG. 3*b* illustrates a second fastening device of the electric module, shown from a second side in the x-y-plane in accordance with an exemplary embodiment. FIG. 3*c* illustrates a third fastening device of the electric module, shown from a second side in the x-y-plane in accordance with an exemplary embodiment. FIGS. 3*a*-3*b* show the fastening device 100 of FIG. 2 viewed from a second side, as indicated by the z-axis of the coordinate system. In contrast to the first, open side, which is dimensioned such that the screw nut can be inserted therethrough, the second side is closed.

In FIG. 3*a*, the stiffening extension 150 can be seen as having a non-circular cross section in the x-y-plane. The cross section of the stiffening extension 150 can be shaped for providing a counter-torque in response to a torque provided by fastening or unfastening a threaded connector for connecting an electric conductor unit.

In an exemplary embodiment of the present disclosure, the non-circular cross section of the stiffening extension 150 provides a toothing. Without toothing, the outer contour of the cross-section of the stiffening extension 150 is convex, e.g., all straight lines whose end-points are within the outer contour can be fully contained within the outer contour. The existence of a toothing is equivalent to an outer contour having a concave portion, e.g., there is at least one straight line which has both end-points within the outer contour, but which nevertheless is partially outside the outer contour. The teeth are then the protruding structures of the toothing.

In FIG. 3*a*, six exemplary teeth of the non-circular shape of the stiffening extension 150 are shown. The number of teeth can vary according to the specification of the fastening device 100. For example, the stiffening extension can have less than six teeth, and in an exemplary embodiment, only two teeth. According to other embodiments, the stiffening extension can have more than six teeth, such as eight, ten or even more than ten teeth for example.

In another exemplary embodiment of the present disclosure, the number of teeth of the stiffening extension corresponds to the number of side faces of the screw nut. By adapting the number of teeth to the number of side faces of the screw nut, the effect of the teeth can be enhanced. The number of teeth corresponding to the number of side faces can ensure efficient dimensioning of the number of teeth and therefore a proper function without the need of large calculations.

The toothing can help to prevent the torque, which can be applied by fastening and/or unfastening a threaded connector for connecting an electric conductor unit in the fastening device 100, from damaging the body of the fastening device. According to an exemplary embodiment of the present disclosure the toothing of the stiffening extension 150 helps to provide a counter-torque. Thereby, the stiffening extension 150, especially the teeth of the stiffening extension 150 can interact with a surrounding material, in which the stiffening extension 150 is embedded, to provide the counter-torque in a sufficient amount.

The stiffening extension can have a center axis, in which case the non-circular outer cross-section of the stiffening extension can define a ratio a/b between a minimum radial distance a, i.e. the radial distance of an innermost portion of the cross-section from the centre axis, and a maximum radial distance b, i.e. the radial distance of an outermost portion of the cross-section from the centre axis. In FIGS. 3*a* to 3*c*, the outermost portion of the cross-section is the tip of any of the teeth, and the innermost portion is the portion of the contour which is in the middle between two neighbouring teeth. In an exemplary embodiment the ratio a/b can be, for example less than 0.9, less than 0.8, less than 0.7, or less than 0.6, as desired.

The stiffening extension provides a cross section in the x-y-plane that can be adapted for interacting with the surrounding solid or viscous material when the surrounding solid or viscous material contacts an outer surface of the stiffening extension to provide a counter-torque as described above.

In an exemplary embodiment of the present disclosure, the surrounding material can be filled between the fastening device 100, being located in a body like a lid or other suitable component and electric components or other suitable device arranged inside the electric module so that the surrounding material surrounds the stiffening extension at least partially. In another exemplary embodiment, if the fastening device is located in or on the electronic device, the surrounding material can encapsulate at least the stiffening extension. In other words, the fastening device and/or the stiffening extension 150 can be embedded in the surrounding material.

The surrounding material can be made from some kind of resin. In other exemplary embodiments the surrounding material can be a thermosetting epoxide polymer, such as for example epoxy or the like.

The surrounding material can be filled at least around the stiffening extension in a viscous state, after the fastening device has been placed on the right position and may then be hardened. The hardened surrounding material can provide a mechanical stability to the screw nut compartment with the stiffening extension of the fastening device. Thus, the surrounding material contacts the stiffening extension. The stiffening extension can be immersed, as a whole, in the surrounding material.

As shown in FIG. 3*a*, the teeth of the stiffening extension can have a substantially conical shape on an outer side. This shape can be used in order to perform a sufficient counter torque. Thereby, the force application point and the force application angle can be set in a desirable and efficient way.

In another exemplary embodiment of the present disclosure the non-circular cross section of the stiffening extension can be adapted for providing a full or a partial counter-torque to the torque applied by fastening and/or unfastening the connector. Thereby, at least a part of the applied torque can be prevented from influencing the body of the fastening device. In other exemplary embodiments, the body can be robust enough to absorb the remaining torque not compensated by the counter-torque.

As shown in FIG. 3*b*, the toothing can comprise rectilinear teeth. FIG. 3*c* illustrates the toothing in an exemplary embodiment that is substantially in the shape of an involute. While the shape of the toothing and/or teeth in FIGS. 3*b*-3*c* differ from that of FIG. 3*a*, the toothing of the forms maintain the general characteristics and features of the former. The teeth can be formed in a manner that provides a sufficient counter-torque and can interact with the surrounding material in an appropriate way.

Figure 4:
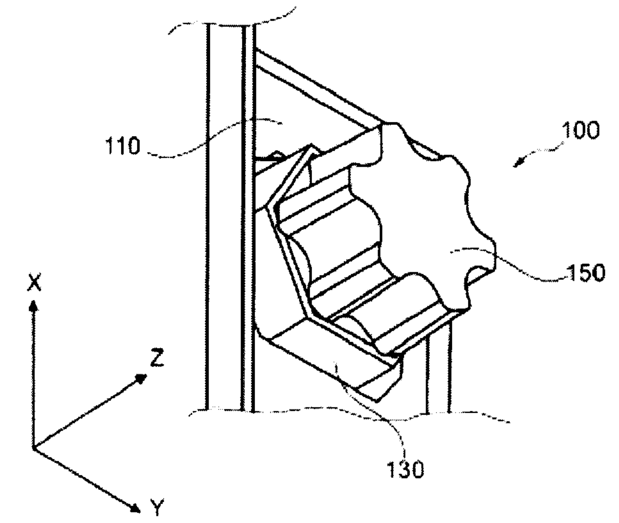
FIG. 4 illustrates a perspective view of a portion of a lid of the electric module in accordance with an exemplary embodiment.

FIG. 4 illustrates a perspective view of a part of a lid of the electric module comprising a fastening device in accordance with an exemplary embodiment. The fastening device 100 can be seen in a perspective view from the second, closed side. The screw nut compartment 130 is shown from the backside as a protrusion. According to an exemplary embodiment, the stiffening extension 150 can extend from the screw nut compartment.

According to another exemplary embodiment of the present disclosure, the outer cross section of the non-circular stiffening extension can be different from the outer cross section of the screw nut compartment. This can also be seen in FIG. 4, where an exemplary screw nut compartment 130 is shown with a hexagonal shape and the stiffening extension 150 provides a toothing. The same can be applied to the inner cross section of the screw nut compartment 130 and the stiffening portion 150. The screw nut compartment 130 can provide a shape of the inner cross section, which is adapted for housing a screw nut therein. In contrast thereto, the stiffening extension 150 can be completely solid or, in en exemplary embodiment, can have a cavity 140 or a recess for holding a connector therein.

In another exemplary embodiment, the screw nut, which is to be inserted in the screw nut compartment, can be a flange nut.

Figure 5:
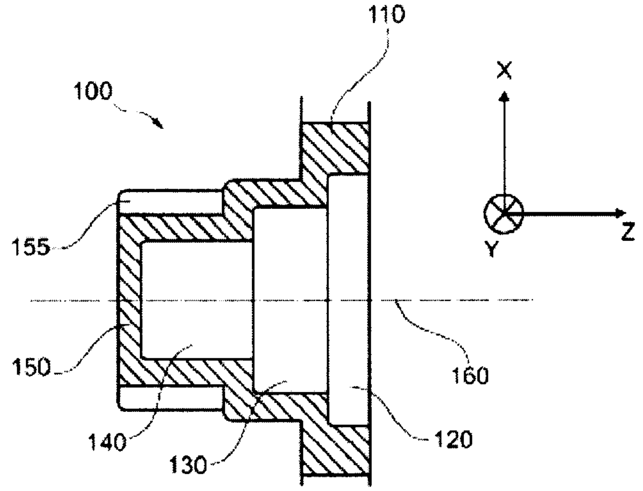
FIG. 5 illustrates a sectional view of a fastening device of the electric module shown in the x-z-plane in accordance with an exemplary embodiment.

FIG. 5 illustrates a sectional view of a fastening device of the electric module, shown in the x-z-plane in accordance with an exemplary embodiment. The fastening device 100 can be located in a body 110. The fastening device can have a recess 120 for mounting and/or construction purposes, a screw nut compartment 130 and a cavity 140. The fastening device 100 can also include a stiffening extension 150 and a central axis 160.

In another exemplary embodiment of the present disclosure, the stiffening extension can have a toothing 155. The stiffening extension can be made from the same material as the body 110 and can further also be produced in the same production step as the body 110. According to another exemplary embodiment, the stiffening extension 150 can be made from a material, which is different from the material of the body 110 and/or can be added after producing the body 110.

The stiffening extension can have a thickness which is at least as large as half the thickness of the screw nut, which can be inserted in the screw nut compartment. The thickness of the stiffening extension can be adapted for stabilizing the fastening device in a sufficient manner and for providing a counter-torque. According to an exemplary embodiment, the stiffening extension can be at least as large as the thickness of the screw nut. Thickness in the context of the present disclosure should be understood as the thickness in the direction of the central axis 160 of the screw nut compartment.

Figure 6:
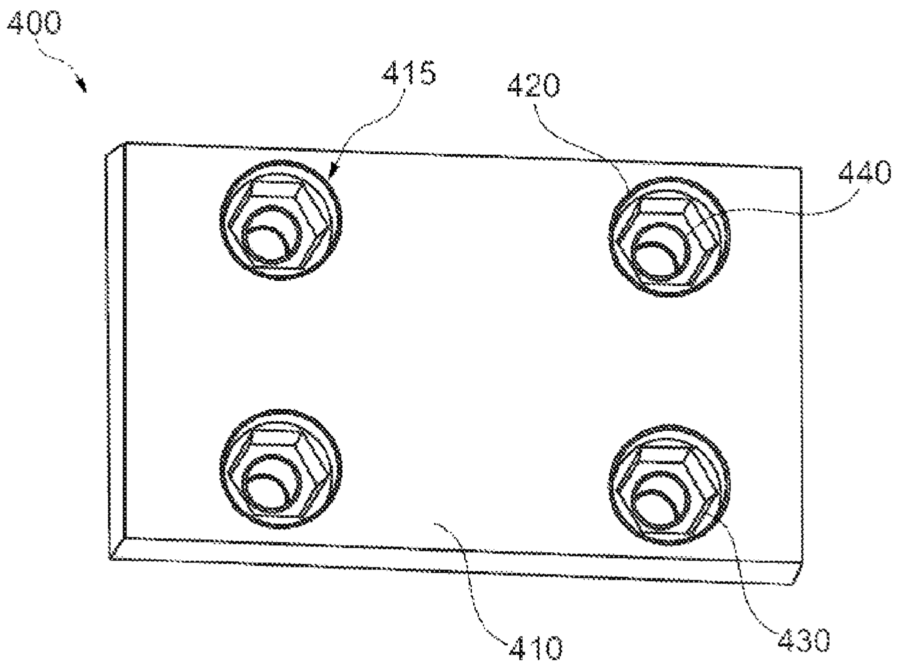
FIG. 6 illustrates a perspective view of a first side of a lid of the electric module in accordance with an exemplary embodiment.

The fastening device can be located on a lid. FIG. 6 illustrates a perspective view of a first side of a lid of the electric module in accordance with an exemplary embodiment. The perspective view of the lid 400 shows the open, first side of the lid 400. In the body 410 of the lid 400, the fastening device 415 can be formed. The fastening device 415 can be, for example, the fastening device 100 as described above.

The fastening device 415 can provide an exemplary recess 420, a screw nut compartment 430 for inserting a screw nut and a cavity 440 for inserting a connector for connecting a conductor unit.

Figure 7:
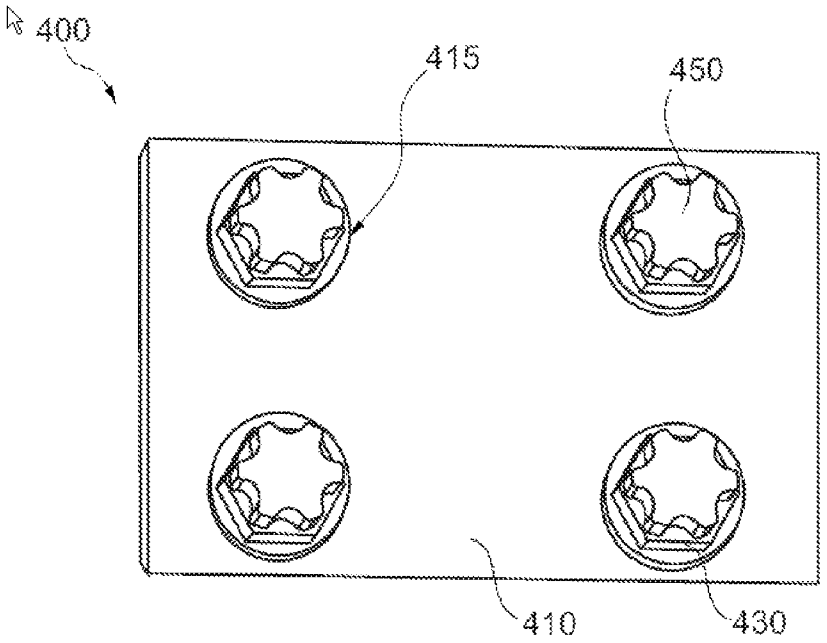
FIG. 7 illustrates a perspective view of a second side of a lid of the electric module in accordance with an exemplary embodiment.

FIG. 7 illustrates a perspective view of a second side of a lid of the electric module in accordance with an exemplary embodiment. In this view, the body 410, the screw nut compartment 430 and the stiffening extension 450 having a different cross section than the screw nut compartment can be seen.

In an exemplary embodiment of the present disclosure, the lid and the fastening device can be integrally formed. For example, the lid can be made from plastics and can be produced by means of a casting technique. Thus, the fastening device can be formed as part of the geometry of the lid. Forming the lid and the fastening device integrally, the efficiency and the costs of the production process can be decreased. Further, the flow of forces can be influenced in a positive manner by forming the body and the fastening device integrally.

The fastening device and/or the lid as described above can be used in an electric module for connecting the electric module with an electric conductor unit. In an exemplary embodiment of the present disclosure, the electric module can include at least one of a transistor, for example an insulated gate bipolar transistor.

The electric conductor unit is a terminal connection for connecting to a terminal of the electric module. The terminal connection can connect a terminal of the electric module to a certain device, such as a power supply or other device as desired.

In another exemplary embodiment of the present disclosure, a method is provided for fastening and/or unfastening at least one electric conductor unit to or from an electric module. A screw nut compartment is provided for housing a screw nut. A threaded connector for connecting the electric conductor unit can be inserted in the screw nut along the central axis of the screw nut from a first, open side. By turning a threaded connector, like screwing a connector, a torque is applied from the screw nut to the screw nut compartment, which is built in or is part of a body. The body can be a lid of an electric module, the electric module itself or the like.

In an exemplary embodiment of the present disclosure, a counter-torque can be provided in response to the torque applied by the screw nut. The counter-torque can be supplied by means of a stiffening extension formed at a second side of the screw nut compartment opposite to the first side. For providing the counter-torque properly, the stiffening extension has a non-circular cross section.

The counter-torque results from an interaction of the stiffening extension with a surrounding solid or viscous material contacting an outer surface of the stiffening section at least partially.

In another exemplary embodiment of the present disclosure, the outer side of the stiffening extension has a toothed shape with at least one tooth. Therefore, the counter-torque results from an interaction of the surrounding material with the at least one tooth.

The disclosure has been described on the basis of embodiments which are shown in the appended drawings and from which further advantages and modifications emerge. However, the disclosure is not restricted to the embodiments described in concrete terms, but rather can be modified and varied in a suitable manner. It lies within the scope to combine individual features and combinations of features of one embodiment with features and combinations of features of another embodiment in a suitable manner in order to arrive at further embodiments.

It will be apparent to those skilled in the art, based upon the teachings herein, that changes and modifications may be made without departing from the disclosure and its broader aspects. That is, all examples set forth herein above are intended to be exemplary and non-limiting.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. An electric module comprising:

a fastening device adapted for fastening at least one electric conductor unit to be fastened at the electric module, the fastening device, which is part of the housing of the electric module, comprising:

a screw nut compartment adapted to receive a screw nut, the screw nut compartment having:

an open first side for inserting at least one of the screw nut and a screw; and a second side arranged opposite to the first side, a stiffening extension formed at the second side of the screw nut compartment wherein the stiffening extension has a non-circular cross section, wherein the electric module includes viscous or solid material, wherein an outer surface of the stiffening extension is in contact with the viscous or solid material, and wherein the non-circular cross-section is shaped for providing a counter-torque in response to a torque from the screw nut, by interacting with the surrounding solid or viscous material.

2. The electric module according to claim 1, wherein the electric module is a power semiconductor module having at least one power semiconductor.

3. The electric module according to claim 1, wherein the part of the housing including the fastening device is plastic, and wherein this part is formed in an injection moulding process.

4. The electric module according to claim 1, wherein the viscous or solid material contains a resin.

5. The electric module according to claim 4, wherein the resin is one of a thermosetting polymer and a thermosetting epoxide polymer.

6. The electric module according to claim 1, wherein the stiffening extension is embedded in the viscous or solid material arranged inside the housing of the electric module.

7. The electric module according to claim 1, wherein the non-circular cross section of the stiffening extension includes a toothing having at least one tooth.

8. The electric module according to claim 1, wherein the non-circular cross section of the stiffening extension has a hexagonal symmetry.

9. The electric module of claim 8, wherein the hexagonal symmetry includes six teeth.

10. The electric module according to claim 1, wherein the screw nut compartment has an inner cross section of a substantially hexagonal shape.

11. The electric module of claim 10, wherein the screw nut compartment has an outer cross section of a substantially hexagonal shape.

12. The electric module according to claim 1, wherein the outer and/or the inner cross section of the stiffening extension is different from the respective outer/inner cross section of the screw nut compartment.

13. The electric module according to claim 1, wherein the stiffening extension has a thickness which is at least as large as half the thickness of the screw nut, wherein thickness is defined in an axial direction of the screw nut compartment.

14. The electric module according to claim 1, wherein the electric conductor unit is a terminal connection for being connected to a terminal of the electric module.

15. The electric module according to claim 14, wherein the lid is integrally formed with the fastening device.

16. The electric module according to claim 14, wherein the lid is plastic.

17. The electric module according to claim 1, wherein the part of the housing comprising the fastening device is a lid.

18. The electric module according to claim 1, wherein the stiffening extension is preferably arranged inside the housing of the electric module.

19. The electric module according to claim 1, wherein the stiffening extension has a thickness at least as large as a thickness of the screw nut.

20. A method for fastening or unfastening at least one electric conductor unit to or from a fastening device of an electric module, wherein the fastening device includes a screw nut compartment in which a screw nut is provided, and a threaded connector for holding the electric conductor, the threaded connector being inserted into the screw nut from an open first side of the screw-nut compartment, the method comprising:

turning a threaded connector along a central axis of a screw nut;

applying a torque from the screw nut to the screw-nut compartment; and providing a counter-torque in response to the torque applied by the screw nut, by means of a stiffening extension formed at a second side of the screw nut compartment opposite to the first side, the stiffening extension having a non-circular cross section; and wherein the counter-torque results from an interaction of the stiffening extension with a surrounding solid or viscous material of the electric module contacting an outer surface of the stiffening section.

21. The method according to claim 20, wherein the outer side of the stiffening extension has a toothed shape having at least one tooth and wherein the counter-torque results from the surrounding material interacting with the at least one tooth.

22. An electric module comprising:

a fastening device configured to fasten at least one electric conductor unit to be fastened at the electric module, the fastening device, which is part of the housing of the electric module, including:

a screw nut compartment configured to receive a screw nut, the screw nut compartment having:

an open first side for inserting at least one of the screw nut and a screw; and a second side arranged opposite to the first side, and a stiffening extension formed at the second side of the screw nut compartment wherein the stiffening extension has a non-circular cross section, wherein the non-circular cross section of the stiffening extension includes toothing having at least one tooth.

23. An electric module comprising:

a fastening device configured to fasten at least one electric conductor unit to be fastened at the electric module, the fastening device, which is part of the housing of the electric module, including:

a screw nut compartment configured to receive a screw nut, the screw nut compartment having:

an open first side for inserting at least one of the screw nut and a screw; and a second side arranged opposite to the first side, and a stiffening extension formed at the second side of the screw nut compartment wherein the stiffening extension has a non-circular cross section, wherein the non-circular cross section of the stiffening extension has a hexagonal symmetry that includes six teeth.

24. An electric module comprising:

a fastening device configured to fasten at least one electric conductor unit to be fastened at the electric module, the fastening device, which is part of the housing of the electric module, including:

a screw nut compartment configured to receive a screw nut, the screw nut compartment having:

an open first side for inserting at least one of the screw nut and a screw; and a second side arranged opposite to the first side, and a stiffening extension formed at the second side of the screw nut compartment wherein the stiffening extension has a non-circular cross section, wherein the stiffening extension has a thickness which is at least as large as half the thickness of the screw nut, and the thickness is defined in an axial direction of the screw nut compartment.

25. An electric module comprising:

a viscous or solid material;

a fastening device configured to fasten at least one electric conductor unit to be fastened at the electric module, the fastening device, which is part of a housing of the electric module, including:

a screw nut compartment configured to receive a screw nut, the screw nut compartment having:

an open first side for inserting at least one of the screw nut and a screw; and a second side arranged opposite to the first side, and a stiffening extension formed at the second side of the screw nut compartment wherein the stiffening extension has a non-circular cross section, wherein an outer surface of the stiffening extension is in contact with the viscous or solid material, and wherein the stiffening extension is arranged inside the housing of the electric module.

* * * * *